United States Patent
Guenin

(10) Patent No.: US 9,207,789 B2
(45) Date of Patent: Dec. 8, 2015

(54) MOTOR VEHICLE CONTROL INTERFACE AND CORRESPONDING METHOD OF MANUFACTURE

(75) Inventor: Gérard Guenin, Villeneuve le Comte (FR)

(73) Assignee: Valeo Systemes Thermiques, Le Mesnil-Saint-Denis (FR)

( * ) Notice: Subject to any disclaimer, the term of this patent is extended or adjusted under 35 U.S.C. 154(b) by 286 days.

(21) Appl. No.: 13/703,086

(22) PCT Filed: Jun. 10, 2011

(86) PCT No.: PCT/FR2011/000342
§ 371 (c)(1),
(2), (4) Date: Mar. 6, 2013

(87) PCT Pub. No.: WO2011/154626
PCT Pub. Date: Dec. 15, 2011

(65) Prior Publication Data
US 2013/0154969 A1 Jun. 20, 2013

(30) Foreign Application Priority Data
Jun. 10, 2010 (FR) ...................................... 10 02453

(51) Int. Cl.
*G06F 3/041* (2006.01)
*B29C 41/12* (2006.01)
(Continued)

(52) U.S. Cl.
CPC ................ *G06F 3/041* (2013.01); *B29C 41/12* (2013.01); *B29C 45/00* (2013.01); *B29C 45/14* (2013.01); *B29C 45/14065* (2013.01); *B29C 45/14467* (2013.01); *B60K 37/02* (2013.01); *B60K 37/04* (2013.01); *B60R 11/02* (2013.01);
(Continued)

(58) Field of Classification Search
CPC ......... G06F 3/041; G06F 17/00; G06F 13/04; G06F 3/0488; G06T 15/70
See application file for complete search history.

(56) References Cited

U.S. PATENT DOCUMENTS

2011/0298808 A1* 12/2011 Rovik ........................... 345/473
2012/0013548 A1* 1/2012 Choi et al. .................... 345/173

FOREIGN PATENT DOCUMENTS

DE 10 2006 012147 A1 3/2007
EP 2 066 162 A1 6/2009
(Continued)

OTHER PUBLICATIONS

International Search Report issued in PCT/FR2011/000342 mailed Sep. 29, 2011 (4 pages).

*Primary Examiner* — Michael Faragalla
(74) *Attorney, Agent, or Firm* — Osha Liang LLP

(57) ABSTRACT

The present invention relates to a motor vehicle control interface comprising a touch-sensitive tile (2) having a front face (3); a housing (4) housing said touch-sensitive tile (2), said housing (4) having—an opening delimited by an edge (5) via which a user can access the front face (3) of the touch-sensitive tile (2); and a levelling trim (6), peripheral to the touch-sensitive tile (2) and interposed between an edge face (7) of the touch-sensitive tile (2) and the edge (5) of the housing (4), characterized in that said interface further comprises a seal (9) inserted between a rear face (10) of the touch-sensitive tile (2) and a retaining projection (11) of the housing (4), said seal (9) bordering the levelling trim (6) between the rear face (10) of the touch-sensitive tile (2) and the retaining projection (11). The present invention also relates to a method of manufacturing such a control interface (1).

14 Claims, 2 Drawing Sheets

Figure 1:
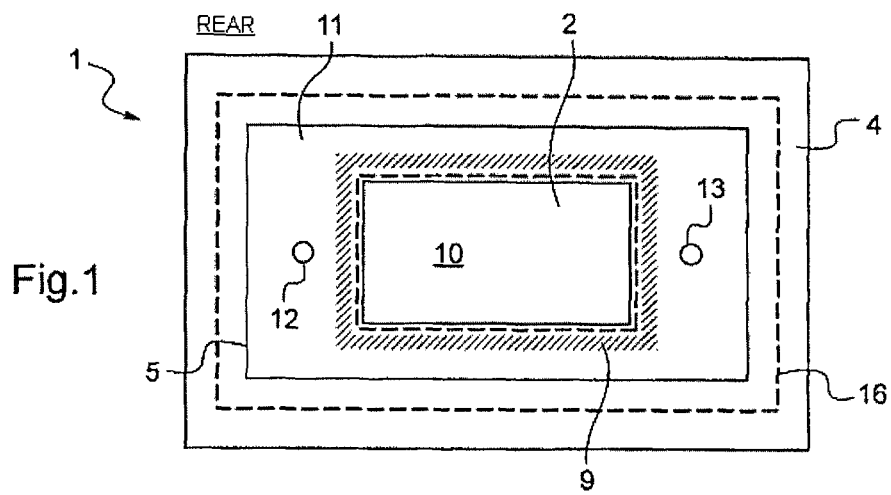

(51) Int. Cl.
  *B29C 45/00* (2006.01)
  *B29C 45/14* (2006.01)
  *B60K 37/02* (2006.01)
  *B60K 37/04* (2006.01)
  *B60R 11/02* (2006.01)
  *G06F 3/01* (2006.01)
  *G06F 3/0354* (2013.01)
  *H03K 17/96* (2006.01)
  *H05K 5/00* (2006.01)
(52) U.S. Cl.
  CPC ............. *G06F 3/01* (2013.01); *G06F 3/03547* (2013.01); *H03K 17/96* (2013.01); *H05K 5/00* (2013.01); *H05K 5/0017* (2013.01); *B29C 2045/14114* (2013.01); *B60K 2350/1024* (2013.01); *B60K 2350/2086* (2013.01); *B60K 2350/925* (2013.01); *B60R 11/0235* (2013.01)

(56) References Cited

FOREIGN PATENT DOCUMENTS

| | | |
|---|---|---|
| EP | 2 154 596 A1 | 2/2010 |
| EP | 2 169 515 A1 | 3/2010 |

* cited by examiner

MOTOR VEHICLE CONTROL INTERFACE AND CORRESPONDING METHOD OF MANUFACTURE

The present invention relates to a control interface for a motor vehicle. More specifically, such an interface finds an advantageous application in controls located near the driver, on the instrument panel or front console of a motor vehicle, for example to control functions of an air conditioning system, an audio system, a telephone system, a multimedia system or even a navigation system. The invention also relates to a method of manufacturing such a control interface.

Motor vehicle control and display devices comprise a display screen for displaying information or control data. These screens may be covered by a transparent touch-sensitive tile allowing the users of the vehicle to input commands. The touch-sensitive tile makes it possible to determine the coordinates of where a user is pressing with a finger, for example using resistive or capacitive technologies.

Touch-sensitive tiles are thin, fragile components revealing salient edges that need to be protected and concealed. To do that, protective surrounds are fitted all around the touch-sensitive tiles, forming a raised shoulder. The display screen therefore has a recessed appearance.

The desire nowadays is to make vehicle facades more ergonomic for the user by offering control interfaces of smooth appearance and uniform touch.

The invention proposes an improved control interface for a motor vehicle and a method of manufacturing such an interface making it possible to obtain an interface facade of smooth appearance with a uniform touch.

To this end, one subject of the present invention is a control interface for a motor vehicle comprising:
- a touch-sensitive tile having a front face,
- a casing housing said touch-sensitive tile, said casing having an opening delimited by a border so that a user can access the front face of the touch-sensitive tile, and
- a leveling compound, peripheral to the touch-sensitive tile and interposed between an edge face of the touch-sensitive tile and the border of the casing, characterized in that said interface also comprises a seal interposed between a rear face of the touch-sensitive tile and a retaining projection of the casing, said seal bordering the leveling compound between the rear face of the touch-sensitive tile and the retaining projection.

Thus it is possible to use a liquid compound introduced through the casing into a peripheral space formed between a stopping-off means at the front, the border and the retaining projection of the casing, the seal and the edge face of the touch-sensitive tile. Once it has polymerized, the liquid compound hardens, thus leveling the front face of the touch-sensitive tile with the edges of the casing. Seepage of leveling compound is thus halted by the seal preventing it from contaminating the rear face of the touch-sensitive tile.

In that way, the assembly clearances needed between the casing and the touch-sensitive tile can be provided in the normal way without that detracting from the sealing of the interface. Likewise, liquid compounds can be chosen from those that are the most fluid so that they better fill any gaps there might be between the border of the casing and the edge face of the touch-sensitive tile without the risk of liquid compound leaking out during the filling of the peripheral space. Seepages into zones of the touch-sensitive tile and that can impair the esthetic and functional appearance of the interface are thus avoided.

According to one embodiment, the seal comprises a foam. The foam is able to apply modest pressure to the touch-sensitive tile, and this prevents it being subjected to loadings that might be interpreted as commands and which might therefore detract for its normal operation. Further, once the liquid of the leveling compound has hardened and the retaining force applied to the casing has been released, the foam seal no longer applies any loading to the touch-sensitive tile, which therefore offers a smooth and uniform appearance. The seal does, however, maintain a function of sealing against any potential contaminants that may originate out of the leveling compound, such as the degassing of a silicone which could impair the view through the touch-sensitive tile. The foam of the seal may be a closed cell foam. The closed cells make it possible to guarantee sealing with respect to the filling compound. The closed-cell foam is, for example, made of polyethylene.

The seal may comprise an adhesion means to make it easier to position it on the touch-sensitive tile.

The retaining projection has, for example, the form of a surround extending from the border of the casing toward the center of the opening.

Further, the retaining projection may have an interior shoulder to retain the seal notably when the retaining force is being applied to the casing.

At least one injection orifice and at least one corresponding vent hole are formed in the retaining projection respectively for introducing liquid leveling compound and for discharging air. The air present in the space peripheral to the touch-sensitive tile is expelled by the arrival of the liquid leveling compound and escapes through the vent hole, allowing the compound to spread out correctly into all the gaps in the peripheral space. Excess compound material can flow into the zones adjacent to the injection orifice or the vent hole without spilling over onto the active surfaces of the touch-sensitive tile situated some distance away and, therefore, without contaminating them. To make the leveling compound more homogeneous, the injection orifice and the vent hole are, for example, positioned on opposite faces of said surround.

The casing may also have at least one strengthening means, of particular usefulness when the casing is made of plastic and the touch-sensitive tile contains glass panels. Specifically, because the thermal expansion coefficients are different and different by a wide margin, the strengthening means strengthens the casing to prevent clearances, openings or cracks appearing at the periphery of the touch-sensitive tile or to prevent shearing of the leveling compound.

Another subject of the present invention is a method of manufacturing a control interface as described hereinabove, characterized in that:
- during a first step, the opening of the casing is positioned around the touch-sensitive tile provided with a film on the front face, the film covering at least the front face of the touch-sensitive tile and the edges of the casing, a seal being interposed between the rear face of the touch-sensitive tile and a retaining projection of the casing,
- during a second step, a retaining force is applied to the casing to hold it in position and to compress the seal between the rear face of the touch-sensitive tile and the retaining projection of the casing, and
- during a third step, the liquid leveling compound is introduced via the injection orifice of the retaining projection which orifice opens into a peripheral space stopped off by the film, the border and the retaining projection of the casing, the seal and the edge face of the touch-sensitive tile, so that the liquid leveling compound can be spread out in said peripheral space.

The film, which is needed to protect and/or to decorate the facade, acts as a barrier to the leveling compound, forming a stopping-off means at the front, thus avoiding the need to use a mold which would have required a number of additional steps during the manufacturing process, including a step of cleaning the leveling compound using mold release agents and a laminating step for unlaminating the film and subsequently pressing it down firmly on the facade of the interface. Likewise, the seal acts as an internal stopper for the leveling compound and notably avoids the need for subsequent steps of cleaning the inside of the casing. In this way, the method is simple because it requires just one operation of introducing the liquid compound. Its quality is improved in relation to the earlier methods of manufacture because this method limits the risks of flash on the surfaces of the touch-sensitive tile. Further, the surface on the facade of the interface is sure to be smooth when the retaining force applied to the seal is removed.

A further subject of the present invention is a method of manufacturing a control interface as described hereinabove, characterized in that:

during a first step, the touch-sensitive tile and the casing are positioned on a preconfigured surface, with the opening of the casing surrounding the front face of the touch-sensitive tile, said opening and said front face being positioned facing the preconfigured surface, a seal being interposed between the rear face of the touch-sensitive tile and a retaining projection of the casing, during a second step, a retaining force is applied to the casing to hold it in position facing the preconfigured surface and to compress the seal between the rear face of the touch-sensitive tile and the retaining projection, and during a third step, the liquid leveling compound is introduced via the injection orifice of the retaining projection which orifice opens into a peripheral space stopped off by the preconfigured surface, the border and the retaining projection of the casing, the seal and the edge face of the touch-sensitive tile, so that the liquid leveling compound can be spread out in said peripheral space, and during a fourth step, a film is applied that covers at least the front face of the touch-sensitive tile, the leveling compound and the edges of the casing.

For example, during the second step, the seal is compressed with a compression ratio of between 5% and 40%. Thus, with a minimum ratio of 5%, the seal will assuredly be compressed to a minimum extent to ensure good sealing and with a maximum ratio of 40%, it is possible to avoid applying to the film excessive forces which could deform it.

Figure 2A:
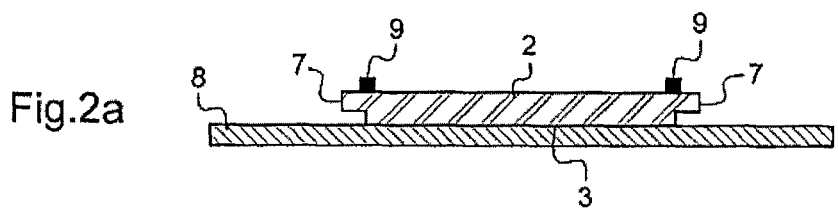
Figure 2B:
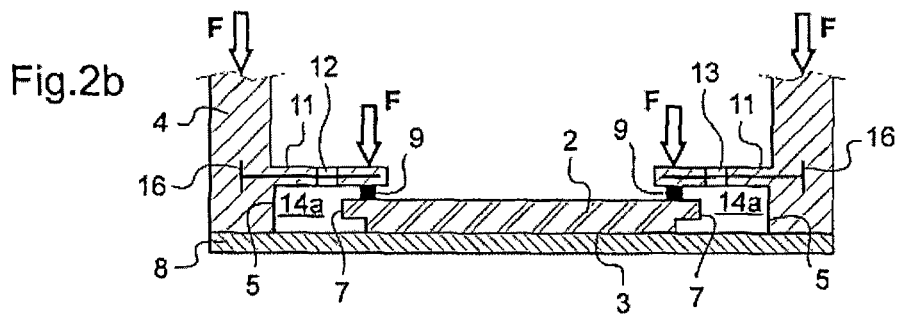
Figure 2C:
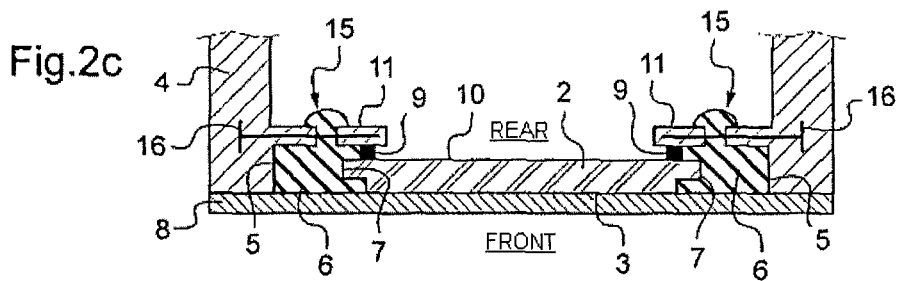
Figure 3A:
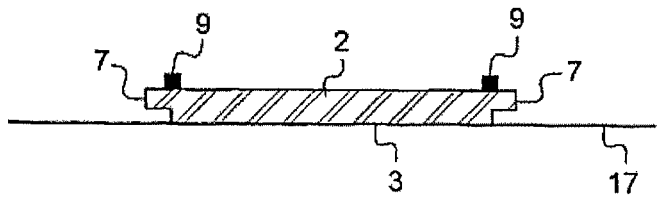
Figure 3B:
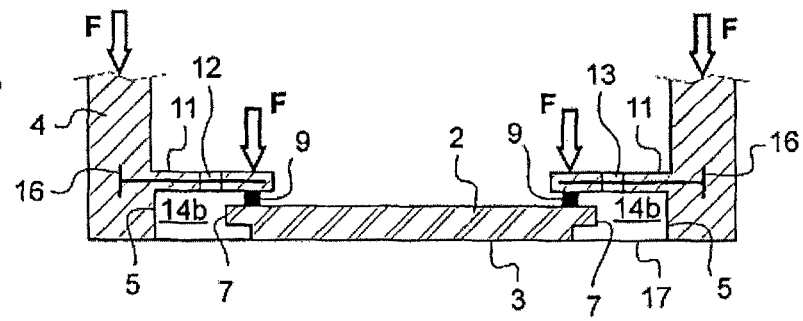
Figure 3C:
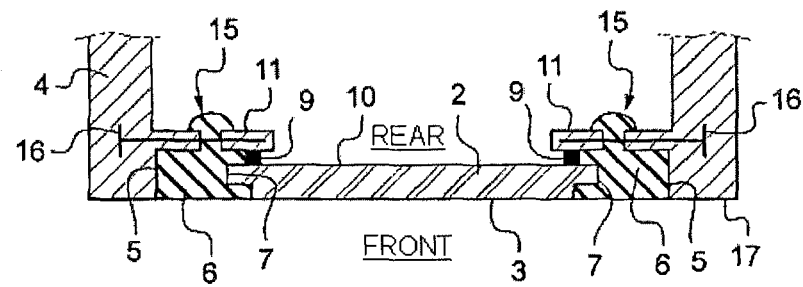
Figure 3D:
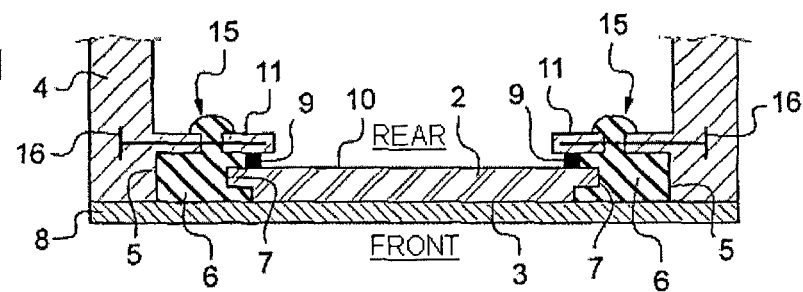

Other features and advantages of the invention will become apparent from the following description, given by way of nonlimiting example, with reference to the attached drawings in which:

FIG. 1 is a schematic rear view of a control interface, in which figure elements of the interface are depicted in dotted line, FIG. 2a is a side view in cross section of a touch-sensitive tile provided with a film and with a seal, of a control interface similar to that of FIG. 1, FIG. 2b is a view similar to FIG. 2a during a second step of a first embodiment of a method of manufacturing a control interface, FIG. 2c is a view similar to FIG. 2a, during a third step of said method of manufacture, FIG. 3a is a side view in cross section of a touch-sensitive tile provided with a seal, of an interface similar to that of FIG. 1, positioned on a flat preconfigured surface, FIG. 3b is a view similar to FIG. 3a during a second step of a second embodiment of a method of manufacturing the control interface, FIG. 3c is a view similar to FIG. 3a during a third step of said method of manufacture, and FIG. 3d is a view similar to FIG. 3a during a fourth step of said method of manufacture.

In these figures, the identical elements bear the same reference numerals.

FIG. 1 depicts a schematic rear view of a control interface 1 for a motor vehicle. The interface 1 may be fixed near to a user, for example on the central console of the vehicle or on the instrument panel (not depicted) in order for example to control functions of air conditioning, of an audio system, of a telephone system, of a multimedia system, or even of a navigation system.

The interface 1 comprises a touch-sensitive tile 2 having a front face 3 (see FIG. 2b), which means a face facing toward the user for inputting commands, a casing 4 housing the touch-sensitive tile 2, said casing 4 having an opening delimited by a border 5 at least in line with the front face 3 of the touch-sensitive tile so as to allow a user to access same, and a leveling compound 6 (see FIG. 2c), interposed between the edge face 7 of the touch-sensitive tile 2 and the border 5 of the casing 4.

The interface 1 also comprises a display screen (not depicted) for displaying information or control data, such as a TFT screen (which uses thin film transistor technology).

The touch-sensitive tile 2 is superposed on the screen and comprises a resistive sensor or a capacitive sensor, the one or the other being at least partially transparent, so that a user can input commands. In the case of a resistive sensor, the latter comprises a main panel and a secondary panel, these two panels being made of glass, the secondary panel being thinner than the main panel. The secondary panel has the function of deforming under a pressure force applied by the finger of the user while the main panel is less deformable, its thickness being such that it does not flex under the effect of pressure applied by the finger of a user. The sensor is thus able to detect the position of the finger of the user using a network of conductors placed between the main panel and the secondary panel, in an arrangement that is, for example, horizontal and vertical. The touch-sensitive tile 2 is electrically connected to an electronic board by means of a multiconductor flex, the electronic board interpreting the detection made by the touch-sensitive tile 2.

As visible in FIG. 2c, the leveling compound 6 is peripheral to the edge face 7 of the touch-sensitive tile 2, to level the front face 3 of the touch-sensitive tile 2 with the edges of the casing 4. Thus, the leveling compound 6 levels the touch-sensitive tile 2 with the casing 4 so that the user perceives only a smooth surface that is uniform to the touch, with no roughnesses or bumps, a finger sliding across the boundary between the touch-sensitive tile 2 and the casing 4 without this boundary being perceptible and which boundary can also be rendered invisible through a suitable choice of colors used, giving the impression of a continuous surface.

The interface 1 further comprises a seal 9 (FIG. 2b), interposed between a rear face 10 of the touch-sensitive tile 2 and a retaining projection 11 of the casing 4, the seal 9 bordering the leveling compound 6 between the rear face 10 of the touch-sensitive tile 2 and the retaining projection 11. Thus it is possible to use a liquid compound and introduce it through the casing 4 into a peripheral space 14a formed between a front stopping-off means, the border 5 and the retaining projection 11 of the casing 4, the seal 9 and the edge face 7 of the touch-sensitive tile 2. After polymerization, the liquid compound hardens, thus leveling the front face of the touch-sensitive tile 2 with the edges of the casing 4. Any seepage of leveling compound 6 is thus stopped by the seal 9, preventing it from contaminating the rear face 10 of the touch-sensitive tile 2.

In that way, the necessary assembly clearances between the casing 4 and the touch-sensitive tile 2 can be provided in the normal way without detracting from the sealing of the interface 1. Likewise, liquid compounds can be chosen from the most fluid compounds in order best to fill the gaps there are between the border of the casing 4 and the edge face 7 of the touch-sensitive tile 2 without the risk of leaks during the filling of the peripheral space 14a with the liquid leveling compound 6. Seepages in zones of the touch-sensitive tile and which could detract from the esthetic and functional appearance of the interface are thus avoided.

The interface 1 also comprises a film 8 on its front facade. The film 8 covers the front face 3 of the touch-sensitive tile 2 accessible to the user (or control surface), the leveling compound 6 and the edges of the casing 4, the dimensions of the film 8 and the dimensions of the interface 1 being similar, or even identical.

The film 8, which is needed for protecting and/or for decorating the facade, has one or more of the following features including: decoration, anti-scratch properties, anti-reflection and diffusing properties, the latter giving the interface a matt appearance and preventing reflective effects that the user finds troublesome, the anti-reflection property preventing any incident light from re-emerging from the surface, diffusion properties scattering the incident light in all directions and/or polarizing properties, i.e. properties likely to bar light reflected by the glass panels of the touch-sensitive tile in a given direction.

Aside from its function of filling shortcomings in the planarity of the front facade of the interface 1, the leveling compound 6 adheres to the film 8 via their common surfaces. The leveling compound 6 also holds the touch-sensitive tile 2 to the casing 4 while at the same time retaining a certain degree of flexibility in order to absorb any loadings on the casing 4 and protects and guides the multiconductor flex which is partially embedded in the leveling compound 6 from vibrations of the motor vehicle or sharp edges of the touch-sensitive tile 2.

For that, a material is chosen that can be injected/poured at low pressure and low temperature, such as an elastomer, such as an EPDM (ethylene propylene diene monomer), a TPE (a thermoplastic elastomer, such as an SEGS (styrene-ethylene-butylene-styrene), SBS (styrene-butadiene-styrene) or TPU (thermoplastic polyurethane) material) or a silicone elastomer. The choice of leveling compound 6 may also lean toward a material that has better fluidity so that it better fills the gaps, and that also has properties of adhesiveness and flexibility, such as a silicone or a glue which hardens following exposure to ultraviolet radiation (or UV glue) or polyurethane glue. When the leveling compound material is polymerized or crosslinked, by heating or after a drying time (silicone) or after exposure to ultraviolet radiation (UV glue), these materials become more rigid, giving an appearance that is smooth to the touch.

The seal 9 for example comprises a foam. The foam 9 allows a modest pressure to be applied to the touch-sensitive tile 2, preventing loadings from being applied to it that could be interpreted as commands and that could detract from its normal operation. Further, once the liquid leveling compound 6 has hardened and the retaining force applied to the casing 4 has been released, the foam seal 9 no longer applies any loading to the touch-sensitive tile 2, which therefore presents a smooth and uniform appearance. The seal 9 does, however, maintain a function of sealing against any potential contaminants that could originate from the leveling compound 6, such as degassing from a silicone that could impair the visibility through the touch-sensitive tile 2.

The foam of the seal 9 is a closed-cell foam. The closed cells make it possible to guarantee sealing against the material of the compound. The closed-cell foam is, for example, made of polyethylene. The foam of the seal 9 may also be made of a silicone or of a rubber.

According to another example, the seal 9 is molded or a lip seal (not depicted).

The seal 9 may comprise an adhesion means to make it easier to position it on the touch-sensitive tile 2. For example, the seal 9 is fixed to the touch-sensitive tile 2 by a double-sided adhesive.

The retaining projection 11 has the form of a surround extending from the border 5 of the casing 4 toward the center of the opening. It is also possible to plan for the retaining projection 11 to be bent over at its free end to form an interior shoulder thus holding the seal 9 notably when the retaining force F is applied to the casing 4 (not depicted).

At least one injection orifice 12 and at least one corresponding vent hole 13 (FIGS. 1 and 2b) are formed in the retaining projection 11 respectively for introducing liquid leveling compound 6 and for discharging air. The air present in the peripheral space 14a of the touch-sensitive tile 2 is expelled by the arrival of the liquid leveling compound 6 and escapes via the vent hole 13, allowing the compound material to spread out correctly into all the gaps of the peripheral space 14a. Surplus leveling compound can flow into the zones 15 near the injection orifice 12 or near the vent hole 13 without overspilling onto the active surfaces of the touch-sensitive tile 2 which are situated remotely, and therefore without contaminating same.

For better homogeneity of the leveling compound 6, the injection orifice 12 and the vent hole 13 may be positioned on opposite faces of the surround.

The casing 4 of the interface 1 may comprise at least one strengthening means 16. The strengthening means 16 is of particular usefulness when the casing 4 is made of plastic and the touch-sensitive tile 2 comprises glass panels. This is because since the thermal expansion coefficients are different and different by a wide margin, the strengthening means 16 strengthens the casing 4 to prevent clearances, openings or cracks from appearing at the periphery of the touch-sensitive tile 2 or to prevent shearing of the leveling compound 6. The strengthening means 16 is a structural element which forms part of or is integral with the casing 4. The strengthening means for example takes the form of a surround, inserted into the retaining projection 11 of the casing 4. It may be overmolded on or completely embedded in the casing 4. The strengthening means 16 is able to enhance the mechanical strength of the casing 4 so that the latter expands in the same way as the touch-sensitive tile 2, when the two of them are subjected to wide temperature variations. For example, the strengthening means 16 is made of metal, such as of steel, giving the casing 4 the mechanical strength it needs to withstand the thermal and mechanical stresses present in a motor vehicle passenger compartment (between $-40°$ C. and $+105°$ C.)

Two methods of the method of manufacture will now be described in greater detail, the first embodiment being illustrated by FIGS. 2a, 2b and 2c and the second embodiment being illustrated by FIGS. 3a, 3b, 3c and 3d.

In the first embodiment, the front face 3 of the touch-sensitive tile 2 is provided beforehand with a film 8, for example a film that has already been coated with glue and protrudes on each side of said front face 3. A seal 9 is positioned, for example using adhesion, on the rear face 10 of the touch-sensitive tile 2 (FIG. 2a).

During a first step, the casing 4 is placed around the touch-sensitive tile 2, with the opening of the casing centered on the touch-sensitive tile 2, the film 8 thus covering at least the front face 3 of the touch-sensitive tile 2 and the edges of the casing 4, the seal being interposed between the rear face 10 of the touch-sensitive tile 2 and a retaining projection 11 of the casing 4 (FIG. 2b).

During a second step, a retaining force F is applied (see arrows in FIG. 2b) to the casing 4 to hold it in position and to compress the seal 9 between the rear face 10 of the touch-sensitive tile 2 and the retaining projection 11. The retaining force F is applied by tooling suited to applying light pressure. For example, the seal 9 is compressed with a compression ratio of between 5% and 40%. Thus, with a minimum ratio of 5%, the seal is certain to be compressed by a minimum amount to ensure good sealing and with a maximum ratio of 40%, it is possible to avoid applying to the film excessive forces that could deform it.

During a third step, the liquid leveling compound 6 is introduced via the injection orifice 12 of the retaining projection 11 which orifice opens into a peripheral space 14a stopped off by the film 8, the border 5 and the retaining projection 11 of the casing 4, the seal 9 and the edge face 7 of the touch-sensitive tile 2, so that the compound can spread out in said peripheral space 14a. The film 8 then acts as a front stop for the leveling compound 6. The liquid leveling compound 6 is introduced by gravity pouring or by injection. The injection is performed at low pressure (<5 bar) and facilitates the flow of liquid leveling compound into the peripheral space that is to be filled of the order of a few tenths.

After polymerization, the liquid leveling compound 6 hardens. Polymerization can be accelerated by heating or by exposure to ultraviolet radiation depending on the type of material chosen for the leveling compound 6.

The film 8 acts as a barrier to the leveling compound 6, forming a stopping-off means at the front, thus avoiding the need to use a mold which would have required several additional steps during manufacture, including a step of cleaning the leveling compound using mold release agents and a laminating step for unlaminating the film 8 and subsequently pressing it down firmly onto the facade of the interface 1. Likewise, the seal 9 acts as an internal stop for the leveling compound 6 and notably avoids subsequent steps of cleaning inside the casing. Thus the method is simple because it requires just one single operation of introducing the liquid leveling compound 6. Its quality is improved with respect to the earlier manufacturing methods because this method limits the risks of flash on the surfaces of the touch-sensitive tile 2. Further, the surface obtained at the facade of the interface is certain to be smooth when the retaining force F applied to the seal 9 is removed.

FIGS. 3a, 3b, 3c and 3d illustrate the second embodiment of the method of manufacture of the interface 1 (only those elements that differ from the first embodiment are described). The method of manufacturing the interface differs chiefly from the first embodiment in terms of the steps described hereinbelow.

During a first step (FIGS. 3a and 3b), the touch-sensitive tile 2 and the casing 4 are positioned on a preconfigured surface 17, for example a flat surface in the case of a touch-sensitive tile 2 made of glass, the opening of the casing 4 surrounding the front face 3 of the touch-sensitive tile 2, the opening and the front face 3 being positioned facing the preconfigured surface 17, the seal 9 being interposed between the rear face 10 of the touch-sensitive tile 2 and a retaining projection 11 of the casing 4.

During a second step (FIG. 3b), a force F is applied to the casing 4 to keep it facing the preconfigured surface 17 and to compress the seal 9, via the retaining projection 11 of the casing 4.

During a third step (FIG. 3c), the liquid leveling compound is introduced via the injection orifice 12 of the retaining projection 11 that opens into a peripheral space 14b stopped off by the preconfigured surface 17, the border 5 and the retaining projection 11 of the casing 4, the seal 9 and the edge face 7 of the touch-sensitive tile 2, so that the compound 6 can spread out in said peripheral space 14b. The preconfigured surface 17 forms a stopping-off means at the front for the liquid leveling compound 6.

During a fourth step (FIG. 3d), the film 8 is laminated (stretched and pressed firmly) onto the front facade of the interface 1, covering the front face 3 of the touch-sensitive tile 2, the leveling compound 6 and the edges of the casing 4, once said front facade has been cleaned and any flash present has been removed.

The invention claimed is:

1. A control interface for a motor vehicle comprising:
 a touch-sensitive tile having a front face;
 a casing housing said touch-sensitive tile, said casing having an opening delimited by a border so that a user can access the front face of the touch-sensitive tile; and
 a leveling compound, peripheral to the touch-sensitive tile and interposed between an edge face of the touch-sensitive tile and the border of the casing,
 wherein said interface also comprises a seal interposed between a rear face of the touch-sensitive tile and a retaining projection of the casing, said seal bordering the leveling compound between the rear face of the touch-sensitive tile and the retaining projection.

2. The interface according to claim 1, wherein said seal comprises a foam.

3. The interface according to claim 2, wherein said seal comprises a closed-cell foam.

4. The interface according to claim 3, wherein said closed-cell foam is made of polyethylene.

5. The interface according to claim 1, wherein said seal comprises an adhesion means.

6. The interface according to claim 1, wherein the retaining projection is in a form of a surround extending from the border of the casing toward the center of the opening.

7. The interface according to claim 1, wherein the retaining projection has an interior shoulder.

8. The interface according to claim 7, wherein at least one injection orifice and at least one corresponding vent hole are formed in the retaining projection respectively for introducing liquid leveling compound and for discharging air.

9. The interface according to claim 8, wherein said injection orifice and said vent hole are positioned on opposite faces of said surround.

10. The interface according to claim 1, wherein the casing has at least one strengthening means.

11. A method of manufacturing a control interface, the method comprising:
 during a first step, the opening of the casing is positioned around the touch-sensitive tile provided with a film on the front face, the film covering at least the front face of the touch-sensitive tile and the edges of the casing, a seal being interposed between the rear face of the touch-sensitive tile and a retaining projection of the casing;

during a second step, a retaining force is applied to the casing to hold the casing in position and to compress the seal between the rear face of the touch-sensitive tile and the retaining projection of the casing; and during a third step, a liquid leveling compound is introduced via the injection orifice of the retaining projection which orifice opens into a peripheral space stopped off by the film, the border and the retaining projection of the casing, the seal and the edge face of the touch-sensitive tile, so that the liquid leveling compound is spread out in said peripheral space.

12. A method of manufacturing a control interface, the method comprising:

during a first step, the touch-sensitive tile and the casing are positioned on a preconfigured surface, with the opening of the casing surrounding the front face of the touch-sensitive tile, said opening and said front face being positioned facing the preconfigured surface, a seal being interposed between the rear face of the touch-sensitive tile and a retaining projection of the casing;

during a second step, a retaining force is applied to the casing to hold the casing in position facing the preconfigured surface and to compress the seal between the rear face of the touch-sensitive tile and the retaining projection;

during a third step, the liquid leveling compound is introduced via the injection orifice of the retaining projection which orifice opens into a peripheral space stopped off by the preconfigured surface, the border and the retaining projection of the casing, the seal and the edge face of the touch-sensitive tile, so that the liquid leveling compound is spread out in said peripheral space; and during a fourth step, a film is applied that covers at least the front face of the touch-sensitive tile, the leveling compound and the edges of the casing.

13. The method of manufacture according to claim 11, wherein, during the second step, the seal is compressed with a compression ratio of between 5% and 40%.

14. The method of manufacture according to claim 12, wherein, during the second step, the seal is compressed with a compression ratio of between 5% and 40%.

* * * * *